United States Patent
Galbraith et al.

(10) Patent No.: US 12,445,142 B2
(45) Date of Patent: Oct. 14, 2025

(54) CHANNEL CIRCUIT WITH ASYNCHRONOUS SAMPLING FROM AN OVERSAMPLED ANALOG-TO-DIGITAL CONVERTER

(71) Applicant: Western Digital Technologies, Inc., San Jose, CA (US)

(72) Inventors: Richard Galbraith, Rochester, MN (US); Michael J. Ross, Rochester, MN (US); Weldon M. Hanson, Rochester, MN (US); John T. Contreras, Palo Alto, CA (US); Iouri Oboukhov, Rochester, MN (US); Niranjay Ravindran, Rochester, MN (US); Pradhan Bellam, Rochester, MN (US); Derrick E. Burton, Ladera Rach, CA (US)

(73) Assignee: Western Digital Technologies, Inc., San Jose, CA (US)

( * ) Notice: Subject to any disclaimer, the term of this patent is extended or adjusted under 35 U.S.C. 154(b) by 230 days.

(21) Appl. No.: 18/354,138

(22) Filed: Jul. 18, 2023

(65) Prior Publication Data

US 2024/0097696 A1 Mar. 21, 2024

Related U.S. Application Data

(60) Provisional application No. 63/407,297, filed on Sep. 16, 2022.

(51) Int. Cl.
 *H03M 1/12* (2006.01)
 *H03M 1/06* (2006.01)
 *H03M 1/20* (2006.01)
(52) U.S. Cl.
 CPC ......... *H03M 1/207* (2013.01); *H03M 1/0629* (2013.01); *H03M 1/1245* (2013.01)

(58) Field of Classification Search
 CPC ... H03M 1/207; H03M 1/0629; H03M 1/1245
 (Continued)

(56) References Cited

U.S. PATENT DOCUMENTS 5,696,639 A 12/1997 Spurbeck
5,726,818 A 3/1998 Reed
(Continued)

OTHER PUBLICATIONS

Konigsberg, et al., "Acquisition Behavior for a HDD Interpolative Timing Recovery System," Department of Electrical Engineering and Computer Science in Partial Fulfillment of the Requirements for the Degrees of Bachelor of Science in Electrical Science and Engineering and Master of Engineering in Electrical Engineering and Computer Science at the Massachusetts Institute of Technology, Cambridge, Massachusetts, pp. 1-52, 1998.

(Continued)

*Primary Examiner* — Peguy Jean Pierre
(74) *Attorney, Agent, or Firm* — Patent Law Works LLP (57) ABSTRACT

Example channel circuits, data storage devices, and methods for asynchronous sampling from an oversampled analog-to-digital converter are described. The channel circuit may include an analog-to-digital converter configured to generate an oversampled digital signal from an analog data signal using a sample rate that is an integer multiple of the baud rate of the channel circuit. A digital sample interpolator may then interpolate interpolated digital signal values from multiple signal values of the oversampled digital signal and select values at baud rate to generate a baud rate digital signal. The baud rate digital signal may be used by an iterative detector in a timing loop and, once a target timing is achieved, for the iterative detector to detect data bits from the interpolated digital signal.

22 Claims, 6 Drawing Sheets

(58) Field of Classification Search
USPC .......... 341/144, 155, 61, 140, 143; 375/233, 375/242
See application file for complete search history.

(56) References Cited

U.S. PATENT DOCUMENTS

| | | | |
|---|---|---|---|
| 5,966,258 A | 10/1999 | Bliss | |
| 5,966,415 A | 10/1999 | Bliss | |
| 6,111,710 A | 8/2000 | Feyh | |
| 7,054,088 B2 | 5/2006 | Yamazaki | |
| 7,411,531 B2 | 8/2008 | Aziz | |
| 7,684,139 B2 | 3/2010 | Eleftheriou | |
| 2007/0115574 A1 | 5/2007 | Eleftheriou | |
| 2011/0291865 A1* | 12/2011 | Sun | H03H 17/0621 341/61 |
| 2012/0274364 A1* | 11/2012 | Chen | H03M 1/0836 327/101 |
| 2021/0297288 A1* | 9/2021 | Guerena | H04L 25/03974 |

OTHER PUBLICATIONS

Oenning et al., "Digital Detection with Asynchronous Sampling using Amplitude Error Prediction," Department of Electrical and Computer Engineering University of Minnesota, Minneapolis, MN, pp. 1-3, 1997.

Spurbeck et al., "Interpolated Timing Recovery for Hard Disk Drive Read Channels," Proceedings of ICC97—International Conference on Communications, Montreal, QC, Canada, vol. 3, pp. 1618-1624, 1997.

\* cited by examiner

CHANNEL CIRCUIT WITH ASYNCHRONOUS SAMPLING FROM AN OVERSAMPLED ANALOG-TO-DIGITAL CONVERTER

TECHNICAL FIELD

The present disclosure relates to read/write channel circuits for data storage devices. In particular, the present disclosure relates to read/write channels using an oversampled analog digital converter (ADC).

BACKGROUND

Data storage devices such as hard disk drives comprise a magnetic disk and a head connected to a distal end of an actuator arm which is rotated about a pivot by a voice coil motor (VCM) to position the head radially over the disk. The disk comprises a plurality of radially spaced tracks for recording user data sectors and servo sectors. The servo sectors comprise head positioning information (e.g., a track address) which is read by the head and processed by a servo control system to control the actuator arm as it seeks from track to track. The magnetic disk acts as a non-volatile storage medium for storing data.

Figure 1:
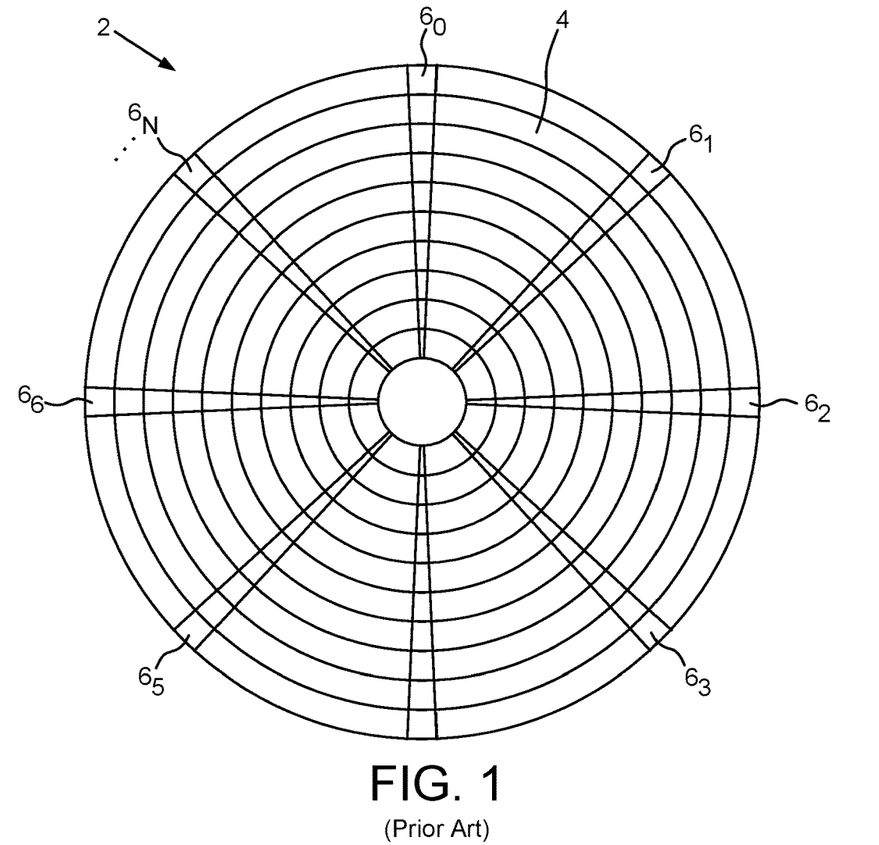
FIG. 1 is a diagram of a prior art disk format comprising a plurality of servo tracks defined by servo sectors.

FIG. 1 shows a prior art disk format 2 as comprising a number of servo tracks 4 defined by servo sectors $6_0$-$6_N$ recorded around the circumference of each servo track. In some configurations, each servo sector comprises a preamble for storing a periodic pattern, which allows proper gain adjustment and timing synchronization of the read signal, and a sync mark for storing a special pattern used to symbol synchronize to a servo data field. The servo data field stores coarse head positioning information, such as a servo track address, used to position the head over a target data track during a seek operation. Each servo sector $6_i$ further comprises groups of servo bursts (e.g., N and Q servo bursts), which are recorded with a predetermined phase relative to one another and relative to the servo track centerlines. The phase-based servo bursts provide fine head position information used for centerline tracking while accessing a data track during write/read operations.

Figure 2:
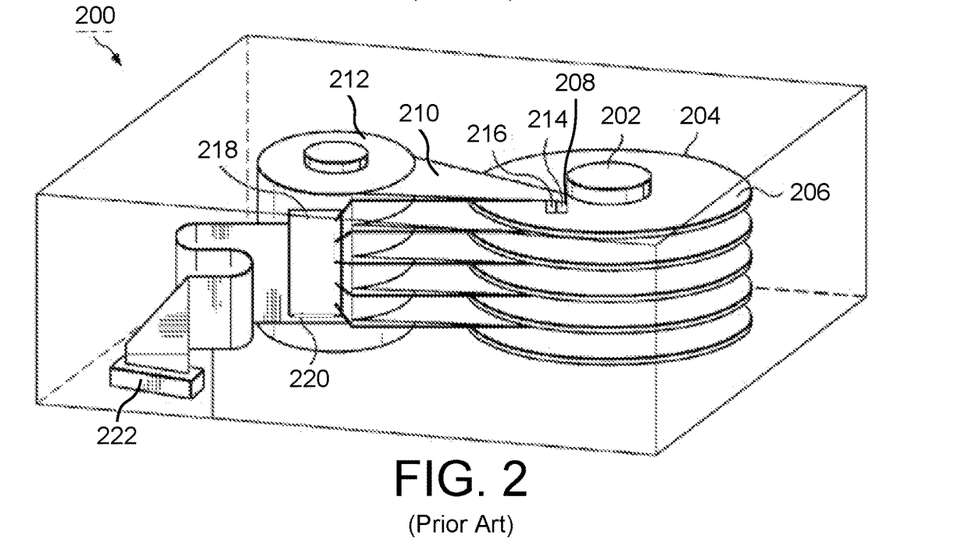
FIG. 2 is a diagram of an example data storage device in the form of a disk drive comprising heads actuated over disk surfaces.

FIG. 2 shows a prior art mechanical configuration for a hard disk drive (HDD) 200 comprising a spindle 202 that holds a plurality of platters 204. Each platter 204 has at least one magnetic surface 206, such as a magnetic surface formatted similarly to disk format 2 in FIG. 1. Magnetic surface 206 may be configured to have digitally encoded data stored thereon as magnetized domains. A head 208 may be mounted at the end of an arm 210 controlled by an actuator 212. A read element 214 may be configured to detect magnetized portions of magnetic surface 206 and generate an analog read signal. A write element 216 may be configured to generate a timed write field to write (or erase) magnetized portions of magnetic surface 206 using an analog write signal. In some configurations, head 208 may include more than one read element 214 and/or write element 216 and HDD 200 may include multiple heads 208, arms 210, and/or actuators 212. A preamplifier (preamp or preamplifier circuit) 218 controls the read and write signals to the corresponding read and write elements (e.g., read element 214 and write element 216) of each head (e.g., head 208). Preamplifier 218 may be attached to a flex circuit 220 that provides a data and power bus connection to a printed circuit board (not shown) with other drive control circuitry, such as a disk drive controller, through a flex interface connector 222.

The disk drive controller may include a read/write channel configured to receive an analog read signal from read element 214 through preamplifier 218 and flex circuit 220. The channel or channel circuit may convert the analog read signal to a digital read signal and perform iterative data detection and decoding to recover the data previously stored to disk surface 206. In some configurations, the channel may be configured to perform data detection and decoding on a plurality of data sectors corresponding to a data track. The channel may return detected data units corresponding to data bit representations in the analog read signal. These data units may be passed from the channel to a host interface. In some embodiments, the storage device controller may include a processor, memory, firmware, and other resources for receiving the data units from the channel, providing those data units to the host (with or without additional processing), and otherwise managing and coordinating the various storage device functions and subsystems.

The data channel includes a timing loop configured to achieve proper gain, phase and frequency lock to the data stream from the analog data signal to properly detect and decode data. Prior data channel configurations may use synchronous sampling, where the clock signal to the analog-to-digital converter (ADC) is interpolated from a time base signal and samples the analog data stream with a sample rate similar to the baud rate of the channel. The timing loop includes the ADC for achieving proper timing.

Technology for a fully digital channel timing loop may be needed. A data channel that uses asynchronous sampling that separates the ADC from the timing loop and allows greater flexibility in the sample rates used by the ADC may be advantageous.

SUMMARY

Various aspects for channel circuits with asynchronous sampling from an oversampled analog-to-digital converter (ADC) are described, particularly read channels configured to use an oversampled ADC and interpolate the oversampled digital signal to the channel baud rate in the timing loop.

One general aspect includes a channel circuit that includes an analog-to-digital converter, configured with a sample rate that is an integer multiple of a baud rate of the channel circuit to generate an oversampled digital signal from an analog data signal, and a digital sample interpolator configured to: receive the oversampled digital signal, interpolate multiple digital sample values from the oversampled digital signal to determine interpolated digital signal values, and output a baud rate digital signal may include of interpolated digital signal values selected at the baud rate of the channel circuit.

Implementations may include one or more of the following features. The analog-to-digital converter may receive a time base signal of at least the sample rate. The channel circuit may include an iterative detector configured to detect data bits from the baud rate digital signal based on a target timing, where the target timing is based on alignment of the selected interpolated digital signal values with data bit representations from the analog data signal. The channel circuit may include an equalization circuit configured to: equalize the baud rate digital signal from the analog-to-digital converter; and provide the baud rate digital signal to the iterative detector. The channel circuit may include a gradient engine configured to: determine a timing gradient from the iterative detector and the equalization circuit; and feedback the timing gradient to the digital sample interpolator, wherein the digital sample interpolator, the iterative detector, the equalization circuit, and the gradient engine may comprise a timing loop configured to align a timing of the baud rate digital signal with the target timing. The channel circuit may include a plurality of iterative detectors configured to detect data bits from a plurality of baud rate digital signals based on a target timing, where the digital sample interpolator is configured with a plurality of offset values for determining the plurality of interpolated digital signals; and the target timing is based on alignment of the selected interpolated digital signal values with data bit representations from the analog data signal. The plurality of offset values may include: a zero offset value; at least one positive offset value; and at least one negative offset value. The digital sample interpolator may use at least two-point polynomial interpolation based on a digital finite impulse response structure. The sample rate of the analog-to-digital converter may be at least double the baud rate of the channel circuit. The channel circuit may include an anti-aliasing filter configured to: receive the oversampled digital signal from the analog-to-digital converter; implement a stop-band for the oversampled digital signal; and output the oversampled digital signal to the digital sample interpolator. A data storage device may include the channel circuit and may further include: a non-volatile storage medium configured to store data, and a read element configured to generate the analog data signal from the non-volatile storage medium.

Another general aspect includes a method that includes: generating, by an analog-to-digital converter configured with a sample rate that is an integer multiple of a baud rate of a channel circuit, an oversampled digital signal from an analog data signal; interpolating, by a digital sample interpolator, multiple digital sample values from the oversampled digital signal to determine interpolated digital signal values; and determining, by the digital sample interpolator and for use by an iterative detector, a baud rate digital signal may include of interpolated digital signal values selected at the baud rate of the channel circuit.

Implementations may include one or more of the following features. The method may include receiving, by the analog-to-digital converter, a time base signal of at least the sample rate. The method may include detecting, by the iterative detector, data bits from the baud rate digital signal based on a target timing, where the target timing is based on alignment of the selected interpolated digital signal values with data bit representations from the analog data signal. The method may include: equalizing the baud rate digital signal from the analog-to-digital converter for use by the iterative detector. The method may include: determining a timing gradient from the iterative detector; feeding back the timing gradient to the digital sample interpolator; and aligning a timing of the baud rate digital signal with the target timing. The method may include: determining, by the digital sample interpolator and using a plurality of offset values, a plurality of baud rate digital signals from the oversampled digital signal; providing the plurality of baud rate digital signals to a plurality of iterative detectors; detecting, by the plurality of iterative detectors and from corresponding baud rate digital signals of the plurality of baud rate digital signals, data bits based on a target timing, where the target timing is based on alignment of the selected interpolated digital signal values with data bit representations from the analog data signal; and selecting, based on a comparison of the detected data bits, the corresponding baud rate digital signal for use in decoding data from the analog data signal. Determining the plurality of interpolated digital signals may include: determining, using a zero offset value, a first baud rate digital signal of the plurality of baud rate digital signals; determining, using a positive offset value, a second baud rate digital signal of the plurality of baud rate digital signals; and determining, using a negative offset value, a third baud rate digital signal of the plurality of baud rate digital signals. Interpolating interpolated digital signal values may use at least two-point polynomial interpolation based on a digital finite impulse response structure. The sample rate of the analog-to-digital converter may be at least double the baud rate of the channel circuit.

Still another general aspect includes a data storage device that includes: a non-volatile storage medium; a channel circuit; means for generating, using a sample rate that is an integer multiple of a baud rate of the channel circuit, an oversampled digital signal from an analog data signal; means for interpolating multiple digital sample values from the oversampled digital signal to determine interpolated digital signal values; means for determining a baud rate digital signal may include of interpolated digital signal values selected at the baud rate of the channel circuit; and means for determining timing for iterative detection of data bits from the baud rate digital signal based on a target timing, where the target timing is based on alignment of the selected interpolated digital signal values with data bit representations from the analog data signal.

The present disclosure describes various aspects of innovative technology capable of improving manufacturing costs, timing performance, and/or error rates by supporting a digital timing loop that receives an oversampled digital signal from an oversampled ADC. The various embodiments include operations and control circuitry to overcome or at least reduce issues previously encountered in data storage devices and, accordingly, are more efficient, reliable, and/or higher performance than other data storage devices. That is, the various embodiments disclosed herein include hardware and/or software with functionality to improve data storage device cost and performance, such as by using an oversampled ADC and a digital signal interpolator that receives the oversampled digital signal and outputs a digital signal at the baud rate of the channel circuit for use in timing recovery and iterative data detection. Accordingly, the embodiments disclosed herein provide various improvements to data storage devices and computing systems incorporating such data storage devices.

BRIEF DESCRIPTION OF THE DRAWINGS

The techniques introduced herein are illustrated by way of example, and not by way of limitation, in the figures of the accompanying drawings in which like reference numerals are used to refer to similar elements.

DETAILED DESCRIPTION

An asynchronous architecture for data channels is described below. The asynchronous architecture is based on an oversampled analog-to-digital converter (ADC), such as a 2×, 4×, or other integer multiple of the nominal channel baud rate. The use of baud rate multiples of at least 2 times the baud rate, with or without smaller offset values (e.g., +/−1/64, 1/16, less than 10%), provides a number of advantages for the ease of interpolation, timing recovery, and signal quality. For example, with a 4× sample rate, baud rate interpolation may be in 1/64 sample steps. The asynchronous architecture with a digital sample interpolator may allow large, instantaneous phase adjustments. In contrast, synchronous architecture that modulates the sampling clock can cause duty cycle and clock slivering issues if phase is adjusted too rapidly. Using 4× baud rate samples, 16 sub-sample interpolation steps may be used in order to achieve interpolated signal values in 1/64 steps. Accurate interpolations may be achieved with relatively simple (2-tap or 3-tap digital finite impulse response structures. In some configurations, an anti-aliasing filter (AAF) using the oversampled data stream provides improved filter response and improved stopband performance. For example, an AAF after the ADC and before signal interpolation may implement a stop-band for the oversampled digital data signal, which may improve the effective number of bits (ENOB) and be compatible with a 5-bit ADC. Integer multiple rate sampling may also avoid risks related to maintaining multiple clock rates within the channel circuit (such as 1× and 1.1× clocks) and resulting coupling and intermodulation issues. For example, non-integer oversampling may result in sampling clocks that have modulation products that fall within the passband of the channel.

The asynchronous architecture may provide a loop latency improvement. Latency in the timing loop may cause loop instability. The ADC and AAF are not inside the timing loop in the asynchronous architecture and a digital sampling interpolator may have a lower latency than the analog clock mixer used in synchronous timing loops. The digital components in the asynchronous (and entirely digital) timing loop may have better tolerance and repeatability compared to the analog components used in prior synchronous architectures. Multiple interpolator outputs are also more practical with a digital asynchronous architecture.

Figure 3:
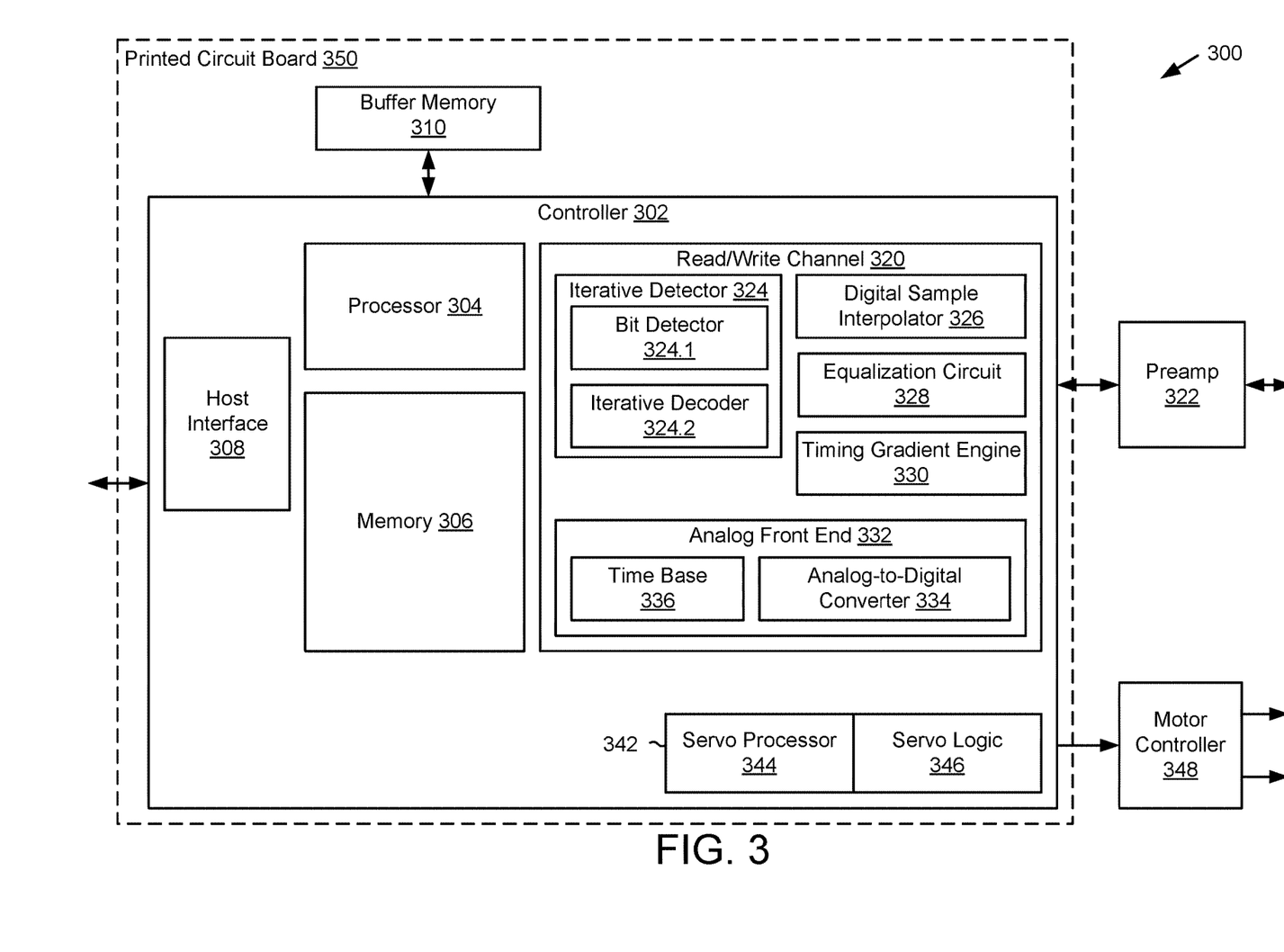
FIG. 3 is a block diagram of a configuration of data storage device electronics for a controller and read/write channel configured for asynchronous sampling from an oversampled ADC.

FIG. 3 shows a portion of example control circuitry 300 for a data storage device, such as a hard disk drive (HDD). In the example shown, control circuitry 300 may include one or more controllers. Controller 302 may comprise a storage device controller configured to receive host storage commands, process storage operations for writing, reading, and managing data stored to non-volatile storage media in the disk drive, such as the magnetic media disks in FIGS. 1 and 2. In some embodiments, controller 302 may correspond to a separate host interface and read/write path to a subset of disk surfaces in a data storage device with multiple controllers. In some embodiments, controller 302 may be configured to manage servo and read/write operations for one or more actuators, heads, and corresponding writer and reader elements.

Controller 302 may comprise a processor 304, a memory 306, a host interface 308, and access to a buffer memory 310. Controllers 302 may also comprise a read/write channel 320, and a servo controller 342 including a servo processor 344 and servo logic 346. In some embodiments, one or more of host interface 308, read/write channel 320, and servo controller 342 may be embodied in separate packages, such as application specific integrated circuits (ASICs), systems on a chip (SOCs), or other specialized circuits that interface with processor 304 and memory 306 for carrying out their respective functions. Controller 302 may include physical and electrical interfaces for connecting to buffer memory 310, a power source (not shown), preamp 322, motor controller 348, other controllers, and/or other circuitry components. In some embodiments, the components of controller 302 may be interconnected by a bus that includes one or more conductors that permit communication among the components. For example, processor 304, memory 306, host interface 308, read/write channel 320, and/or servo controller 342 may be components attached to a printed circuit board assembly (PCBA) 350 that provides one or more layers of interconnect conductors among the components.

Processor 304 may include any type of conventional processor or microprocessor that interprets and executes instructions. Memory 306 may include a random access memory (RAM) or another type of dynamic storage device that stores information and instructions for execution by processor 304 and/or a read only memory (ROM) or another type of static storage device that stores static information and instructions for use by processor 304 and/or any suitable storage element, such as a system portion of a hard disk media or a solid state storage element. Memory 306 may be configured to store controller firmware, comprising instructions that include one or more modules or sub-modules for specific data storage device operations and processor 304 may execute those instructions, including controlling communication with other components, such as host interface 308, buffer memory 310, read/write channel 320, and servo controller 342.

Host interface 308 may include any transceiver-like mechanism that enables the data storage device to communicate with other devices and/or systems, such as a host system for which the storage device provides data storage. Host interface 308 may comprise a host storage interface compliant with one or more storage interface standards, such as a Serial Advanced Technology Attachment (SATA) interface, a Small Computer System Interface (SCSI), serial attached SCSI (SAS), peripheral computer interface express (PCIe) (e.g., Non-Volatile Memory Express (NVMe)), etc., for connecting host interface 308 to peripheral interface or network port.

Buffer memory 310 may include a RAM, flash, or another type of dynamic storage device for storing host data and other information in transit between the storage media of the storage device and the host (via host interface 308). In some embodiments, buffer memory 310 is a separate memory device from memory 306 and the disk surfaces or other non-volatile memory of the data storage device.

Read/write channel 320 may include one or more specialized circuits configured for processing binary data to be written to the disk surfaces using an analog write signal and processing the analog read signal from the disk surfaces back into binary data. For example, read/write channel 320 may include a write path comprised of various data scramblers, run-length limited (RLL) encoders, iterative error correction code (ECC) encoders, precompensation circuits, and other data or signal processing components. Read/write channel 320 may include a read path comprised of various amplifiers, filters, equalizers, analog-to-digital converters (ADCs), soft information detectors, iterative ECC decoders, and other data or signal processing components. The write channel components may comprise a write channel circuit and the read channel components may comprise a read channel circuit, though the circuits may share some components. Read/write channel 320 may provide the analog write signal to and receive the analog read signal from preamp 322, which controls and amplifies signals to and from the heads. Binary data for recording to the storage medium may be received by read/write channel 320 from controller firmware and decoded data from read/write channel 320 may be passed to controller firmware and/or directed to buffer memory 310 for communication to the host.

In some configurations, read/write channel 320 may include an analog front end 332 configured to receive the analog read signal from preamp 322 and convert it into a digital read signal for processing by other components of read/write channel 320. For example, analog front end 332 may include an ADC 334 that receives an analog data signal from preamp 322 and generates a digital signal for use by other components of read/write channel 320. In some configurations, analog front end 332 may include a timing circuit, and one or more filters, equalizers, and/or other signal conditioning components for generating the digital read signal. In some configurations, analog front end 332 may rely on filtering, equalization, and other analog signal conditioning to be carried out by preamp 322. In some configurations, the timing circuit for the read channel may be embodied in the digital components of read/write channel 320 (i.e., outside analog front end 332) and ADC 334 may operate from time base 336 to achieve its configured sample rate (including an oversampled sample rate).

In some configurations, read write channel 320 may include an iterative detector 324 configured to receive read data from the read heads and use iterative bit detection and ECC processing to decode the received read data into decoded data for further processing by controller firmware and/or communication to the host. For example, iterative detector 324 may include one or more bit detectors 324.1, such as soft output Viterbi algorithm (SOVA) detectors, and one or more iterative decoders 324.2, such as low density parity check (LDPC) decoders operating on multi-bit encoded symbols to decode each sector of data received by read/write channel 320. Iterative detector 324 may receive a digital read signal from ADC 334 in analog front end 332. In some configurations, ADC 334 may generate an oversampled digital signal that is processed by digital sample interpolator 326 and equalization circuit 328 before reaching iterative detector 324.

Iterative detector 324 may be sensitive to variations in timing, frequency, and gain in the received digital signals and may operate most effectively when the timing of the digital samples they are processing aligns with the timing of the bit representations in the analog data signal. The actual timing of the bit representations in the read signal generated from the disk may be referred to as a target timing that corresponds to an ideal alignment of digital samples with bit representations in the read signal. This target timing may be known generally to the read channel based on data formatting parameters (e.g., data frequency for the disk/track/etc.) and matched to the baud rate of the channel circuit, but the specific timing of the read signal may need to be periodically reestablished and maintained by a timing loop to address transient offset or timing mismatch with the target timing. In some configurations, the operations of iterative detector 324 may generate data that assists read/write channel 320 in determining whether or not the digital signal samples are aligned with the target timing of the read signal. In some embodiments, one or more outputs from iterative detector 324 may be provided to timing gradient engine 330 for determining a timing gradient between the timing of a most recently processed set of digital samples and the target timing. The timing gradient values may be fed back to digital sample interpolator 326 to iteratively improve timing alignment. In some configurations, digital sample interpolator 326, equalization circuit 328, iterative detector 324, and timing gradient engine 330 may comprise a timing loop, such as an asynchronous digital timing loop within read/write channel 320.

Digital sample interpolator 326 may include one or more circuits for receiving an oversampled digital signal from ADC 334, selecting a set of oversampled digital signal values, interpolating a series of interpolated digital signal values between and across multiple oversampled digital signal values, and selecting baud rate sample values from the oversampled digital signal values—converting a digital signal at the oversampled sample rate to a digital signal at the baud rate of the data channel. Digital sample interpolator 326 may output the baud rate digital signal to other components of read/write channel 320, such as iterative detector 324 and/or equalization circuit 328. In some configurations, digital sample interpolator 326 may be comprised of one or more digital finite impose response (DFIR) structures configured for interpolating the incoming oversampled data stream. For example, digital sample interpolator 326 may be configured for multipoint polynomial interpolation, such as two-point, three-point, four-point, or more interpolation, and use a DFIR with a number of taps equal to the number of interpolation points. In some configurations, the tap weights used in the DFIR may be derived using an interpolating polynomial that passes through N-sample points. For example, 16 sets of tap weights may be used to interpolate in 1/16 steps between adjacent 4× rate samples, resulting in 64 steps between baud rate samples. The interpolated digital signal values between adjacent oversampled digital sample values (whether based on two-point, three-point or more interpolation) may assembled in a continuous stream for selecting sample values from the stream at the baud rate. Digital sample interpolator 326 may operate on a set of oversampled sample values of at least the oversampling rate and determine a curve between adjacent oversampled values. For example, with a 4× sample rate and based on 16 interpolated values, a 64-step curve of interpolated digital signal values may be used for determining each baud rate digital signal value. Digital sample interpolator 326 may select the corresponding baud rate interpolated signal values from anywhere among the interpolated digital signal values in the 64-step curve, enabling the resulting baud rate digital signal to be asynchronously determined from the oversampled digital signal. The baud rate sample values may not align with any single oversampled sample value. For example, once timing is established, digital sample interpolator 326 may select interpolated digital signal values along the interpolated digital signal at 64 step increments corresponding to the baud rate, regardless of where those baud rate sample points fall on the curve. In some configurations, a lower oversampling rate (e.g., 2×) may use a higher number of interpolation points and/or steps to achieve a desired level of granularity in the interpolated digital signal values.

In some configurations, digital sample interpolator 326 may receive one or more timing gradient values from timing gradient engine 330. Digital sample interpolator 326 may include logic to use the timing gradient values to move the baud rate sample points to better align with the target timing of analog data signal. For example, the timing gradient values received may include an estimated delta value between the current timing being used by digital sample interpolator 356 and the target timing, as determined by the operations of equalization circuit 328 and iterative detector 324. As part of the timing loop, digital sample interpolator 326 may adjust the timing setpoint for baud rate sampling of the interpolated digital signal values between and across the oversampled sample values. For example, the timing gradient values may indicate that the baud rate sampling should be moved forward or back by a delta unit, such as one or more $1/64^{th}$ steps along the interpolated curve. In some configurations, digital sample interpolator 326 may include timing control logic for using timing gradient feedback to manage timing alignment for the timing loop.

Equalization circuit 328 may include logic for receiving the digital signal from ADC 334 and/or digital sample interpolator 326. In some configurations, equalization circuit 328 may be configured between digital sample interpolator 326 and iterative detector 324 to equalize the baud rate digital signal for use by iterative detector 324. For example, a two-dimensional adaptive equalization circuit may receive and equalize the baud rate digital signal. In some configurations, equalization circuit 328 may determine anomalies in the baud rate digital signal that may indicate a timing error. Data representing detected or potential timing errors may be directed to timing gradient engine 330 for determining timing gradients and influencing the timing loop.

Timing gradient engine 330 may include logic for receiving timing data from iterative detector 324 and/or equalization circuit 328. For example, iterative detector 324 and/or equalization circuit 328 may determine signal processing factors indicative of skewed timing and quantify the direction and/or magnitude of the timing skew. The resulting timing data may be provided to timing gradient engine 330 to calculate a timing gradient value for correcting or at least reducing the timing error. For example, timing gradient engine 330 may use peak sample data and an idealized peak value to determine an estimated magnitude of the timing error and use other patterns in the baud rate digital signal to indicate whether the timing error is leading or lagging the target timing. In some configurations, one or more target timing values may describe an idealized set of signal values (and/or corresponding ranges) for the timing of the bit representations from the analog data signal. Based on a comparison of the timing data from the other components in the timing loop to the corresponding target timing values, timing gradient engine 330 may determine the timing gradient value to be sent to digital sample interpolator 326 for timing correction. In some configurations, timing gradient engine 330 may include logic for varying the timing gradient values through successive iterations to improve the performance of iterative detector 324 and/or equalization circuit 328 and may use performance data from one or both components as timing data for aligning the timing of digital sample interpolator 326 with the improved performance and, effectively, the target timing.

Analog-to-digital converter 334 may include an analog circuit that generates and outputs digital sample values by sampling an analog input at a particular sample rate. For example, ADC 334 may convert an analog read signal of time-varying voltages representing the bits stored in a non-volatile storage medium to a series of discrete sample values corresponding to the magnitude of the voltage at the sample time. The sample rate of ADC 334 determines the number of samples determined per unit time. Because of the digital output of ADC 334, the digital functions are governed by a digital timing signal or time base 336 provided by the digital electronics and power source to which ADC 334 is connected. In some configurations, ADC 334 may be configured for oversampling relative to the baud rate of read/write channel 320. For example, controller 302 may support a time base signal that is substantially higher than the baud rate of the data channels and this higher time base 336 may be used to drive ADC 334 to oversample the analog data symbol at an oversampling sample rate that is an integer multiple of the baud rate by 2× or more. In some configurations, time base 336 may support a sampling rate of 4× or more for ADC 334, resulting in an oversampled digital signal comprised of four oversampled digital sample values for every single baud rate digital sample value. ADC 334 may output the oversampled digital signal comprised of oversampled digital sample values to digital sample interpolator 326. In some configurations, the oversampled digital signal may pass through an anti-aliasing filter before reaching digital sample interpolator 326.

Servo controller 342 may include one or more specialized circuits configured to process servo data, such as position error signals, from the disk surfaces and providing a control signal to position the actuators in a closed-loop control system. Servo controller 342 may also receive commands from processor 304 for positioning operations, such as seek, track follow, load, unload, sweep, idle, and other actuator positioning operations. Servo controller 342 may also implement servo error recovery processes for recovering from servo errors. In some embodiments, servo controller 342 may include servo processor 344 and servo logic 346 (stored in a servo memory). For example, servo processor 344 may be a dedicated processor circuit and servo logic 346 may be firmware stored in RAM associated with the dedicated processor to provide dedicated computing resources for managing the servo functions. Servo controller 342 may receive servo signals read from the disk surface using preamp 322 and provided to servo controller 342. Servo controller 342 may provide servo control signals to motor controller 348 and motor controller 348 may control one or more actuator VCMs and/or a spindle motor for rotating the disk stack.

Figure 4:
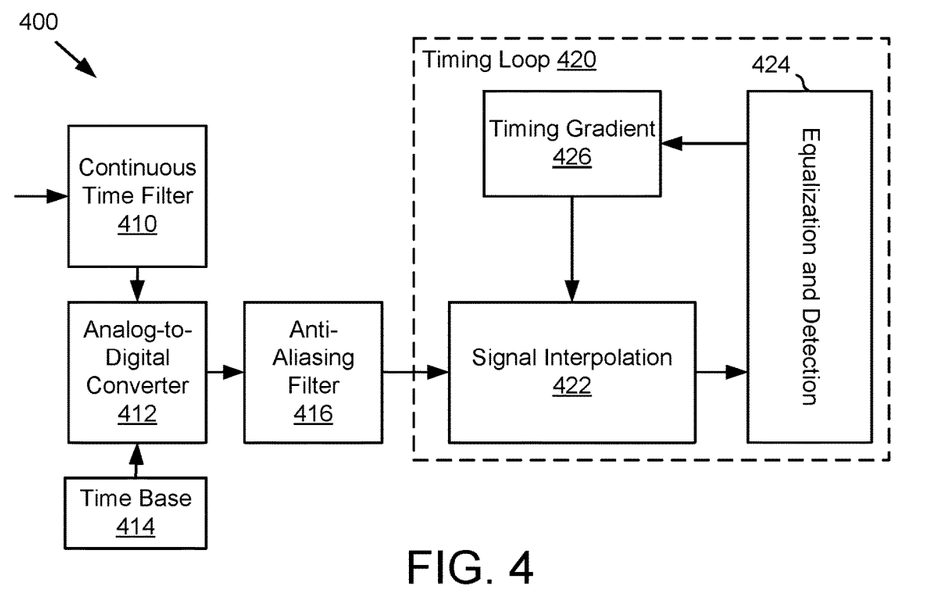
FIG. 4 is a block diagram of a portion of an example channel circuit with an oversampled ADC and asynchronous timing loop.

FIG. 4 shows an example asynchronous sampling architecture 400 with an oversampled ADC and digital timing loop. In some configurations, architecture 400 may be implemented in a channel circuit, such as read/write channel 320 in control circuitry 300 in FIG. 3. For example, an analog data signal, such as the read signal from preamp 322, may be received by continuous time filter 410 and processed using the components of asynchronous sampling architecture 400 to establish timing for signal equalization and data bit detection and decoding in the read channel.

Continuous time filter 410 may include analog logic for filtering the analog data signal from the preamp to adjust the frequency of the incoming read data signal. In some configurations, due to the higher (oversampling) sample rate of ADC 412 and the asynchronous digital timing loop 420, the design of continuous time filter 410 may be simplified. In some configurations, gain control and other analog signal conditioning operations may be executed prior to the analog data signal reaching ADC 412.

ADC 412 may operate substantially as described above regarding ADC 334, receiving a time base 414 that supports a sample rate that is an integer multiple of the baud rate of the channel circuit and timing loop 420. For example, ADC 412 may be a 5-bit ADC configured for 4× oversampling of the analog data signal to generate four oversampled digital sample values per bit time of timing loop 420. Time base 414 may be based on a digital timing signal with a frequency of at least the oversampling sample rate, such as a timing signal used for other digital components of a data storage device controller.

Anti-aliasing filter 416 may receive the oversampled digital data signal from ADC 334 and output a filtered version of the oversampled digital data signal to digital sample interpolator 326. For example, the anti-aliasing filter may be a low pass filter with a cutoff frequency set to the Nyquist frequency value for the oversampling sample rate. The anti-aliasing filter may improve the effective number of bits (ENOB) received by digital sample interpolator 325 by providing an additional stop band.

Timing loop 420 may be comprised of signal interpolation 422, equalization and detection 424, and a timing gradient 426 that is fed back to adjust the timing during signal interpolation 422. For example, a digital sample interpolator may receive the oversampled digital signal from ADC 412, interpolate a series of interpolated digital signal values across two or more digital samples in the oversampled digital signal, and select baud rate sample values from the interpolated digital signal values according the current timing for timing loop 420.

The digital sample interpolator may pass the selected baud rate sample values in a baud rate digital signal for equalization and detection 424. An equalization circuit and iterative detector may receive the baud rate digital signal and use it for equalization and data detection. Equalization and detection 424 may generate timing data indicative of misalignment of the current timing with a target timing.

The timing data generated by equalization and detection 424 may be used to determine one or more timing gradients 426. For example, the equalization circuit and/or iterative detector may provide timing data to a timing gradient engine configured to determine a delta value indicating a direction and/or magnitude of the timing error. The delta value may be used as or determine timing gradient 426 for adjusting the sample timing of signal interpolation 422. For example, on a next iteration through timing loop 420, the digital sample interpolator may use timing gradient 426 to adjust the timing of the baud rate samples relative to prior samples and/or each other in an attempt to better align the timing for the next iteration with the target timing. Timing loop 420 may iterate through signal interpolation 422, equalization and detection 424, and timing gradient 426 to continuously monitor and adjust the timing of the read channel in the channel circuit.

Figure 5:
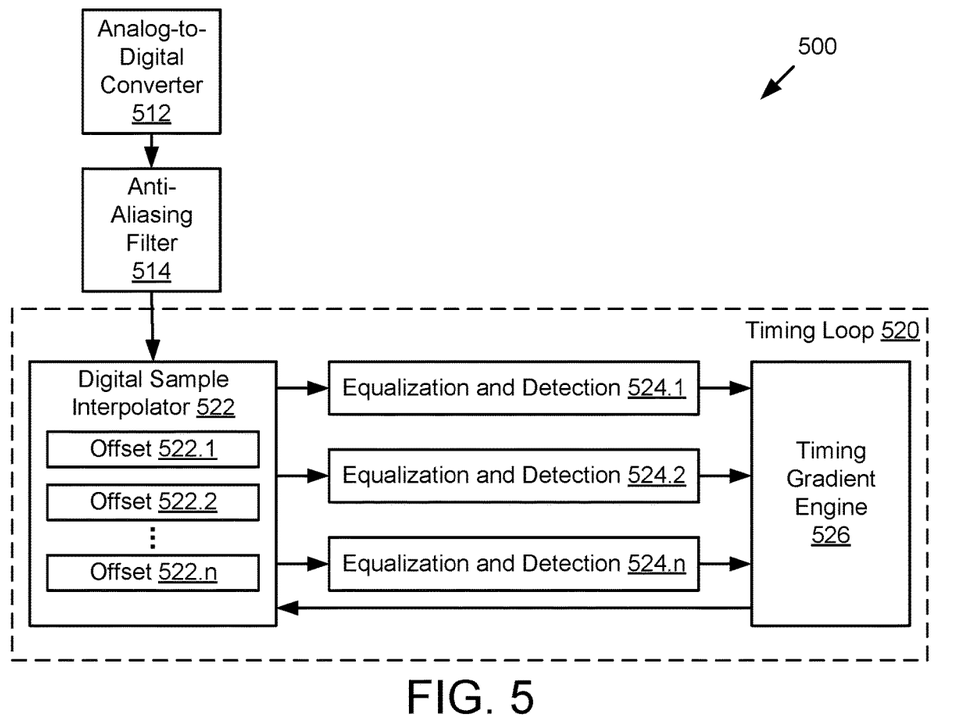
FIG. 5 is a block diagram of a portion of an example channel circuit with an oversampled ADC and digital sample interpolator supporting multiple offsets and equalization/detection paths.

FIG. 5 shows an example architecture 500 for an asynchronous digital timing loop that includes multiple timing offsets and corresponding equalization and detection paths. In some configurations, architecture 500 may be implemented in a channel circuit, such as read/write channel 320 in control circuitry 300 in FIG. 3. For example, an analog data signal, such as the read signal from preamp 322, may be received by ADC 512 and processed using the components of architecture 500 to establish timing for signal equalization and data bit detection and decoding in the read channel. The multiple timing offsets may enable the read channel to attempt equalization and detection at different timings and select the most effective timing for data detection and decoding in any given iteration. The offset of the most effective timing may also be sent to timing gradient engine 526 for feedback to digital sample interpolator 522 and adjusting the zero offset for the next iteration.

ADC 512 may operate substantially as described above regarding ADC 334 and operate at a sample rate that is an integer multiple of the baud rate of the channel circuit and timing loop 520. For example, ADC 512 may be a 5-bit ADC configured for 4× oversampling of the analog data signal to generate four oversampled digital sample values per bit time of timing loop 520. ADC 512 may output the oversampled digital signal to anti-aliasing filter 514. Anti-aliasing filter 514 may be configured to provides improved filter response and improved stopband performance for filtering higher order frequency content out of the oversampled digital signal.

Timing loop 520 may be comprised of digital sample interpolator 522, multiple equalization and detection paths 524.1-524.$n$, and a timing gradient engine 526 that feeds back a timing gradient for adjusting the timing used by during digital sample interpolator 522. For example, digital sample interpolator 522 may receive the filtered oversampled digital signal from ADC 512 and anti-aliasing filter 514, interpolate a series of interpolated digital signal values across two or more digital samples in the oversampled digital signal, and select baud rate sample values at the different offsets 522.1-522.$n$ from the interpolated digital signal values according the current timing for timing loop 520.

Digital sample interpolator 522 may operate substantially as described above regarding digital sample interpolator 326 in FIG. 3. Once the interpolated steps between and across the oversampled digital signal values are calculated for the signal curve, a current timing may be used to select a set of baud rate sample values. This first set of baud rate sample values may generate a baud rate digital signal with a zero offset value (e.g., offset 522.1) that corresponds to the current "best-guess" timing relative to the target timing. Digital sample interpolator 522 may be configured for any number of additional offset values (e.g., offsets 522.2-522.$n$). These additional offset values may be used to select additional sets of baud rate sample values from the interpolated digital signal values. In some configurations, offsets 522.1-522.$n$ may include positive offset values and negative offset values. For example, positive offset values may shift the timing and sample selection ahead along the interpolated digital signal and negative offset values may shift the timing and sample selection back along the interpolated digital signal. In some configurations, offsets 522.1-522.$n$ may include offset values based on the steps in the interpolated digital signal. For example, in a 4× oversampled digital signal interpolated with 16 steps between adjacent samples, there are 64 steps per sample at baud rate. Offsets 522.1-522.$n$ may be configured as positive or negative values equal to a single step or multiple steps. For example, positive offsets may include +1/64 and/or +1/32 and negative offsets may include −1/64 and/or −1/32. In some configurations, offsets 522.1-522.$n$ may include a zero offset, a positive offset at one step value and a negative offset at one step value to select a set of samples at the current timing, a set of samples one interpolated value ahead of current timing, and a set of samples one interpolated value behind the current timing.

One or more equalization circuits and iterative detectors may receive the multiple baud rate digital signals from digital sample interpolator 522. The equalization circuits may operate substantially as described above regarding equalization circuit 328 in FIG. 3. The iterative detectors may operate substantially as described above regarding iterative detector 324 in FIG. 3. In some configurations, the equalization circuit may be configured with a number of equalization paths equal to the number of parallel baud rate digital signals generated by digital sample interpolator 522, such as three baud rate digital signals (e.g., zero offset, one-step positive offset, and one-step negative offset). Each equalization path may independently equalize their respective digital signal and generate any corresponding timing data. In some configurations, the iterative detector may be configured with a number of detection paths equal to the number of parallel baud rate digital signals generated by digital sample interpolator 522. Each detection path may independently detect bits from their respective digital signal and generate any corresponding timing data. For example, the iterative detector may include independent SOVA detectors and/or LDPC decoders for each detection path. Each equalization and detection path 524.1-524.n may generate timing data indicative of misalignment of their current timing (with offset) with the target timing.

In some configurations, equalization and detection paths 524.1 may also include decision logic for determining which path and corresponding timing offset has generated the best results. For example, one or more equalization and detection outputs may be compared across the paths to determine which has performed best. In some configurations, successful detection and/or decoding of data from the respective baud rate digital signals may be used to determine the best timing and, where multiple paths are successful (or none are), secondary criteria, such as number of iterations within the iterative detector, may be used to determine the best timing. Successfully decoded data selected from the path with the best timing may be output by the read channel. Note that, depending on the condition of the system and the timing accuracy of timing loop 520, the best timing may still not be equivalent to the target timing and correspond to some level of timing error. Timing data from the equalization and detection path with the best timing may still generate timing data that is forwarded to timing loop 520. In some configurations, the timing data from each equalization and detection path 524 may be provided to timing gradient engine 526 for determining the timing gradient to be fed back to digital sample interpolator 522.

Timing gradient engine 526 may operate substantially as described for timing gradient engine 330 in FIG. 3. Some or all of the timing data generated by equalization and detection 524 may be used by timing gradient engine 526 to determine one or more timing gradients. For example, timing gradient engine 526 may be configured to determine a delta value indicating a direction and/or magnitude of the timing error from the best timing among equalization and detection paths 524. In some configurations, the offset value corresponding to the baud rate digital signal used in the best path may be selected as the delta value for the timing gradient. In some configurations, a more complex set of timing data from all paths and relations among their performance may be used to determine the timing gradient. Timing gradient engine 526 may feedback the timing gradient value to digital sample interpolator 522 for modifying the timing of the next set of baud rate digital samples for the zero offset path. For example, on a next iteration through timing loop 520, the digital sample interpolator 522 may use the timing gradient to adjust the timing of the zero offset baud rate samples relative to prior samples and/or each other in an attempt to better align the timing for the next iteration with the target timing. The other offsets may then be applied from the new zero offset timing. Timing loop 520 may iterate through digital sample interpolator 522, equalization and detection paths 524.1-524.n, and timing gradient engine 526 to continuously monitor and adjust the timing of the read channel in the channel circuit.

Figure 6:
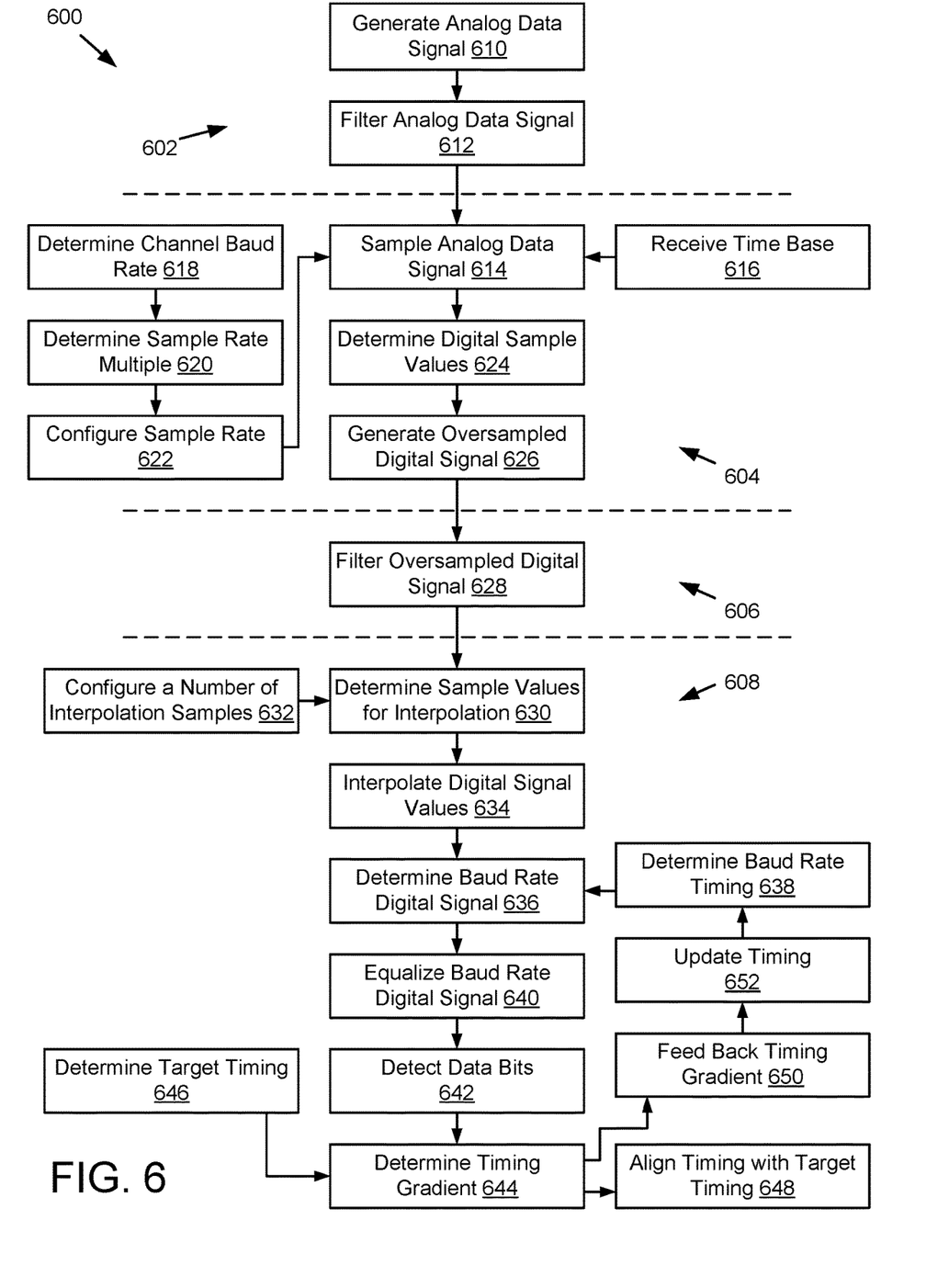
FIG. 6 is an example method of asynchronous timing recovery based on an oversampled ADC and digital signal interpolation.

As shown in FIG. 6, control circuitry 300 may be operated according to an example method of asynchronous timing recovery based on an oversampled ADC and digital signal interpolation, i.e., according to the method 600 illustrated by blocks 610-654. In some configurations, blocks 614-654 may be implemented in decision logic within a read channel circuit. For example, blocks at 602 may be implemented outside the channel circuit, such as in the preamp. Blocks at 604 may be implemented by an oversampled ADC. The block at 606 may be implemented by an anti-aliasing filter. Blocks at 608 may be implemented by an asynchronous digital timing loop.

At block 610, an analog data signal is generated. For example, a read element passing over a magnetic storage medium with previously stored data responds to the magnetic flux to generate an analog read signal that is amplified by preamp circuitry.

At block 612, the analog data signal is filtered. For example, the analog data signal in or from the preamp may be passed through a continuous time filter.

At block 614, the analog data signal may be sampled. For example, an ADC may receive the filtered analog data signal and generate digital samples from the analog data signal at a sample rate for the ADC.

At block 616, a time base may be received by the ADC. For example, the ADC may receive a time base of at least the sample rate from storage device controller electronics.

At block 618, a channel baud rate may be determined. For example, the data storage device may be configured with a data format and read channel electronics that support a particular baud rate for bit detection and decoding.

At block 620, a sample rate multiple may be determined. For example, an integer multiple of the sample rate may be selected to be compatible with interpolation and other read channel circuitry, such as 2× or 4×.

At block 622, a sample rate may be configured. For example, the ADC may be selected and/or configured to support an oversampled sample rate equal to the baud rate times the sample rate multiple.

At block 624, digital sample values may be determined. For example, the analog data signal may be sampled at the sample rate to generate a stream of digital magnitude values corresponding to the analog data signal at the sample times.

At block 626, an oversampled digital signal may be generated. For example, the ADC may output the stream of digital sample values at the sample rate as an oversampled digital signal.

At block 628, the oversampled digital signal may be filtered. For example, the oversampled digital signal from the ADC may pass through an anti-aliasing filter.

At block 630, sample values may be determined for interpolation. For example, a digital sample interpolator may be configured to select two or more sample values from the oversampled digital signal to interpolate values between.

At block 632, a number of interpolation samples may be configured. For example, the digital sample interpolator may be selected or configured for two-point, three-point, or more interpolation and a corresponding number of sample values may be determined at block 630.

At block 634, digital signal values may be interpolated. For example, the digital signal sample interpolator may interpolate digital signal values between multiple sample values from the oversampled digital signal.

At block 636, a baud rate digital signal may be determined. For example, based on the baud rate timing determined by the timing loop, the digital signal interpolator may select from among the interpolated digital signal values at the baud rate to determine the baud rate digital signal.

At block 638, baud rate timing may be determined. For example, the digital signal interpolator may use a current timing value for the timing loop for determining the timing of the interpolated digital signal values selected at block 636.

At block 640, the baud rate digital signal may be equalized. For example, an equalization circuit may receive the baud rate digital signal to equalize the signal.

At block 642, data bits may be detected. For example, an iterative detector may receive the equalized baud rate digital signal and use it for iterative bit detection through a SOVA detector.

At block 644, a timing gradient may be determined. For example, a timing gradient engine may receive timing data from the iterative detector and/or equalization circuit and determine a delta value for correcting the timing to more closely align with a target timing.

At block 646, a target timing may be determined. For example, the target timing may be based on the actual alignment of bit representations in the analog data signal and various secondary indicators of that alignment may be determined from the operation of the iterative bit detector and/or the equalization circuit and quantified in timing data from those components.

At block 648, the baud rate timing may be aligned with the target timing. For example, the timing gradient engine may determine at block 644, based on the timing data from the iterative detector, that the current timing is functionally aligned with the target timing and the iterative detector is successfully detecting and decoding data bits without further modification of the timing. In some configurations, a timing gradient of zero may still be fed back at block 650.

At block 650, the timing gradient may be fed back in the timing loop. For example, the timing gradient engine may feed back the timing gradient to the digital sample interpolator.

At block 652, the baud rate timing may be updated. For example, the digital sample interpolator may shift the baud rate timing forward or backward by one or more interpolated digital signal values based on the timing gradient and the previous timing.

Figure 7:
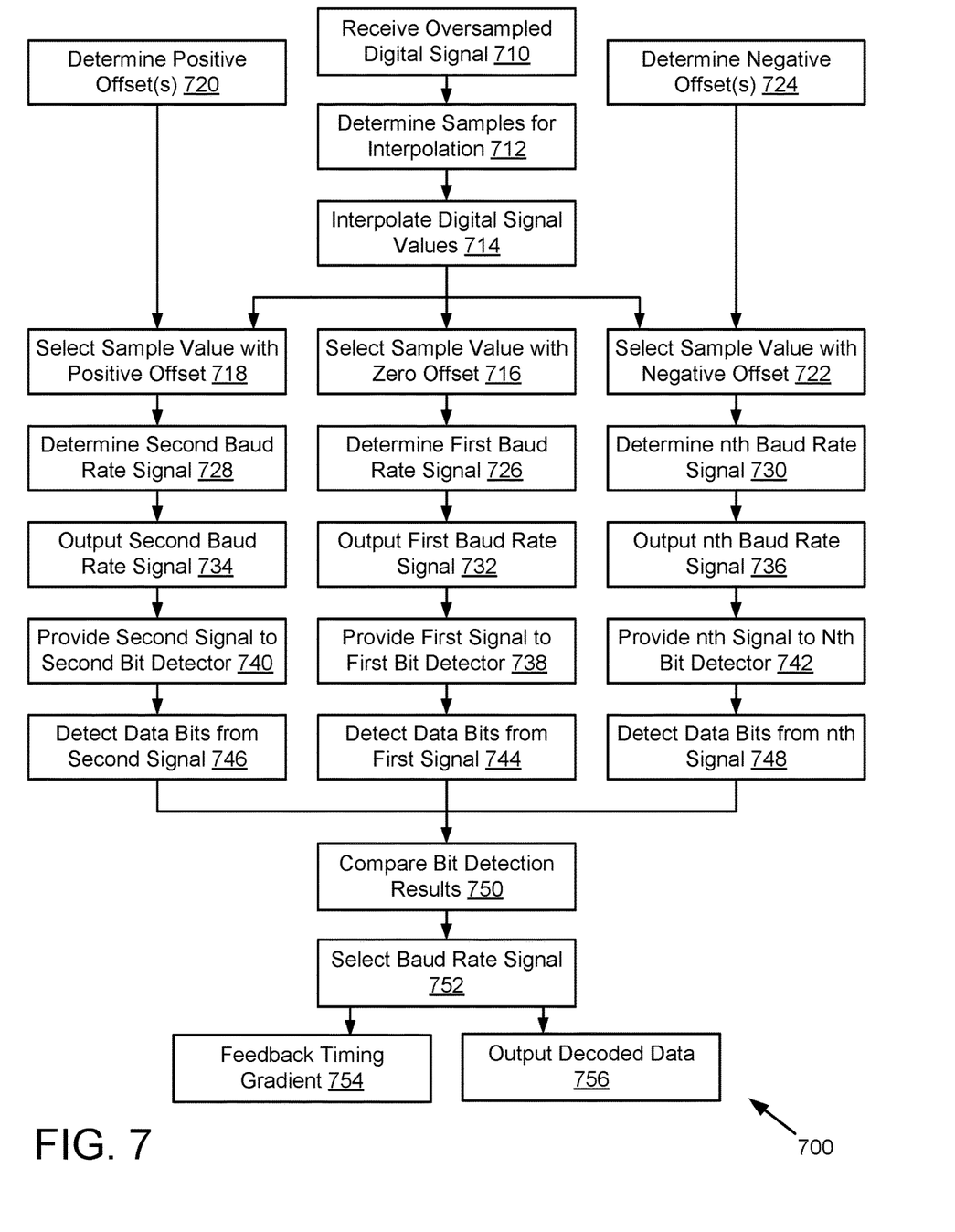
FIG. 7 is an example method of asynchronous timing recovery using multiple offsets and detection paths.

As shown in FIG. 7, control circuitry 300 may be operated according to an example method of asynchronous timing recovery using multiple offsets and detection paths, i.e., according to the method 700 illustrated by blocks 710-756. In some configurations, blocks 710-756 may be implemented in decision logic within a read channel circuit.

At block 710, an oversampled digital signal is received. For example, a digital sample interpolator may receive the oversampled digital signal from an ADC with an oversampled sample rate.

At block 712, sample values may be determined for interpolation. For example, a digital sample interpolator may be configured to select two or more sample values from the oversampled digital signal to interpolate values between the selected sample values.

At block 714, digital signal values may be interpolated. For example, the digital signal sample interpolator may interpolate digital signal values between multiple sample values from the oversampled digital signal.

At block 716, a sample value may be selected with a zero offset from the current baud rate timing. For example, the digital signal interpolator may use a current baud rate timing value to select a next sample value among the interpolated digital signal values from block 714.

At block 718, a sample value may be selected with a positive offset from the current baud rate timing. For example, the digital signal interpolator may use a positive offset from the current baud rate timing value to select a different next sample value among the interpolated digital signal values, compared to the sample value selected at block 716.

At block 720, one or more positive offsets may be determined. For example, the digital signal interpolator may be configured with multiple offset values that include at least one positive offset for moving the sampled value forward among the interpolated digital signal values.

At block 722, a sample value may be selected with a negative offset from the current baud rate timing. For example, the digital signal interpolator may use a negative offset from the current baud rate timing value to select a different next sample value among the interpolated digital signal values, compared to the sample value selected at block 716.

At block 724, one or more negative offsets may be determined. For example, the digital signal interpolator may be configured with multiple offset values that include at least one negative offset for moving the sampled value backward among the interpolated digital signal values.

At block 726, a first baud rate digital signal may be determined. At block 728, a second baud rate digital signal may be determined. At block 730, an nth baud rate digital signal may be determined. For example, the digital signal interpolator may determine parallel baud rate digital signals with the different timing offsets based on the corresponding samples selected at blocks 716, 718, and 722.

At block 732, the first baud rate digital signal may be output. At block 734, the second baud rate digital signal may be output. At block 736, the nth baud rate digital signal may be output. For example, the digital signal interpolator may output the baud rate digital signals with different timing offsets to different bit detectors through different equalization and detection paths.

At block 738, the first baud rate digital signal may be provided to a first bit detector. At block 740, the second baud rate digital signal may be provided to a second bit detector. At block 742, the nth baud rate digital signal may be provided to an nth bit detector. For example, the channel circuit may include a dedicated bit detector for each offset and corresponding detection path and each bit detector may be configured to directly or indirectly receive the corresponding baud rate digital signal output at blocks 732, 734, and 736.

At block 744, data bits are detected from the first baud rate digital signal. At block 746, data bits are detected from the second baud rate digital signal. At block 748, data bits are detected from the nth baud rate digital signal. For example, each bit detector may attempt to detect data bits from their respective signals and may each perform differently based on the impact of the timing offsets.

At block 750, bit detection results may be compared. For example, an iterative detector including the bit detectors and/or a timing gradient engine associated with the timing loop may compare one or more outputs of the bit detectors to determine which timing resulted in the best data detection results.

At block 752, a baud rate digital signal may be selected. For example, based on the comparison at block 750, the iterative detector and/or timing gradient engine may determine and select the best performing timing offset and corresponding baud rate digital signal.

At block 754, a timing gradient may be fed back in the timing loop. For example, the timing gradient engine may determine a timing gradient based on the selected baud rate digital signal and feed it back to the digital sample interpolator for adjusting the current timing used for the zero offset path.

At block 746, decoded data may be output. For example, the iterative decoder may complete decoding based on the selected baud rate digital signal and output the resulting decoded data to controller firmware and/or the host.

Figure 8:
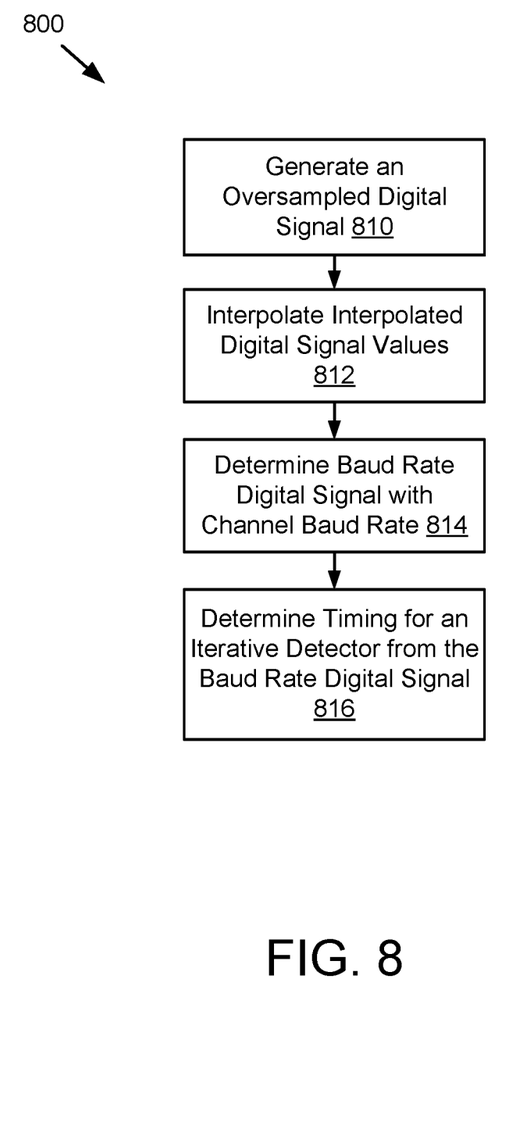
FIG. 8 is another example method of asynchronous timing recovery based on an oversampled ADC and digital signal interpolation.

As shown in FIG. 8, control circuitry 300 may be operated according to an example method of asynchronous timing recovery based on an oversampled ADC and digital signal interpolation, i.e., according to the method 800 illustrated by blocks 810-816. In some configurations, blocks 810-816 may be implemented in decision logic within a read channel circuit.

At block 810, an oversampled digital signal may be generated. For example, an ADC configured with a sample rate that is an integer multiple of the baud rate of the read channel may receive an analog data signal read from a storage medium and generate an oversampled digital signal based on sampling the analog data signal at the sample rate.

At block 812, interpolated digital signal values may be interpolated. For example, a digital sample interpolator may interpolate digital signal values between the multiple samples in the oversampled digital signal using multipoint interpolation.

At block 814, a baud rate digital signal may be determined with the channel baud rate. For example, the digital sample interpolator may select among the interpolated digital signal values at a rate corresponding to the baud rate and based on a current timing for a timing loop.

At block 816, the timing for an iterative detector may be determined from the baud rate digital signal. For example, the iterative detector may receive the baud rate digital signal from the digital sample interpolator and attempt to perform bit detection based on the signal timing in the baud rate digital signal. The iterative detector may determine timing data indicative of a timing error and the timing error may be fed back to the digital sample interpolator as a timing gradient to improve the alignment of the signal timing with a target timing based on alignment of the selected interpolated digital signal values in the baud rate digital signal with data bit representations from the analog data signal.

Technology for asynchronous sampling of an oversampled signal for supporting a digital timing loop in a data channel circuit is described above. In the above description, for purposes of explanation, numerous specific details were set forth. It will be apparent, however, that the disclosed technologies can be practiced without any given subset of these specific details. In other instances, structures and devices are shown in block diagram form. For example, the disclosed technologies are described in some implementations above with reference to particular hardware.

Reference in the specification to "one embodiment" or "an embodiment" means that a particular feature, structure, or characteristic described in connection with the embodiment is included in at least one embodiment or implementation of the disclosed technologies. The appearances of the phrase "in one embodiment" in various places in the specification are not necessarily all referring to the same embodiment or implementation.

Some portions of the detailed descriptions above may be presented in terms of processes and symbolic representations of operations on data bits within a computer memory. A process can generally be considered a self-consistent sequence of operations leading to a result. The operations may involve physical manipulations of physical quantities. These quantities take the form of electrical or magnetic signals capable of being stored, transferred, combined, compared, and otherwise manipulated. These signals may be referred to as being in the form of bits, values, elements, symbols, characters, terms, numbers, or the like.

These and similar terms can be associated with the appropriate physical quantities and can be considered labels applied to these quantities. Unless specifically stated otherwise as apparent from the prior discussion, it is appreciated that throughout the description, discussions utilizing terms for example "processing" or "computing" or "calculating" or "determining" or "displaying" or the like, may refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

The disclosed technologies may also relate to an apparatus for performing the operations herein. This apparatus may be specially constructed for the required purposes, or it may include a general-purpose computer selectively activated or reconfigured by a computer program stored in the computer. Such a computer program may be stored in a computer readable storage medium, for example, but is not limited to, any type of disk including floppy disks, optical disks, CD-ROMs, and magnetic disks, read-only memories (ROMs), random access memories (RAMs), erasable programmable read-only memories (EPROMs), electrically erasable programmable read-only memories (EEPROMs), magnetic or optical cards, flash memories including universal serial bus (USB) keys with non-volatile memory or any type of media suitable for storing electronic instructions, each coupled to a computer system bus.

The disclosed technologies can take the form of an entire hardware implementation, an entire software implementation or an implementation containing both hardware and software elements. In some implementations, the technology is implemented in software, which includes but is not limited to firmware, resident software, microcode, etc.

Furthermore, the disclosed technologies can take the form of a computer program product accessible from a non-transitory computer-usable or computer-readable medium providing program code for use by or in connection with a computer or any instruction execution system. For the purposes of this description, a computer-usable or computer-readable medium can be any apparatus that can contain, store, communicate, propagate, or transport the program for use by or in connection with the instruction execution system, apparatus, or device.

A computing system or data processing system suitable for storing and/or executing program code will include at least one processor (e.g., a hardware processor) coupled directly or indirectly to memory elements through a system bus. The memory elements can include local memory employed during actual execution of the program code, bulk storage, and cache memories which provide temporary storage of at least some program code in order to reduce the number of times code must be retrieved from bulk storage during execution.

Input/output or I/O devices (including but not limited to keyboards, displays, pointing devices, etc.) can be coupled to the system either directly or through intervening I/O controllers.

Network adapters may also be coupled to the system to enable the data processing system to become coupled to other data processing systems or remote printers or storage devices through intervening private or public networks. Modems, cable modems, and Ethernet cards are just a few of the currently available types of network adapters.

The terms storage media, storage device, and data blocks are used interchangeably throughout the present disclosure to refer to the physical media upon which the data is stored.

Finally, the processes and displays presented herein may not be inherently related to any particular computer or other apparatus. Various general-purpose systems may be used with programs in accordance with the teachings herein, or it may prove convenient to construct more specialized apparatus to perform the required method operations. The required structure for a variety of these systems will appear from the description above. In addition, the disclosed technologies were not described with reference to any particular programming language. It will be appreciated that a variety of programming languages may be used to implement the teachings of the technologies as described herein.

The foregoing description of the implementations of the present techniques and technologies has been presented for the purposes of illustration and description. It is not intended to be exhaustive or to limit the present techniques and technologies to the precise form disclosed. Many modifications and variations are possible in light of the above teaching. It is intended that the scope of the present techniques and technologies be limited not by this detailed description. The present techniques and technologies may be implemented in other specific forms without departing from the spirit or essential characteristics thereof. Likewise, the particular naming and division of the modules, routines, features, attributes, methodologies and other aspects are not mandatory or significant, and the mechanisms that implement the present techniques and technologies or its features may have different names, divisions and/or formats. Furthermore, the modules, routines, features, attributes, methodologies and other aspects of the present technology can be implemented as software, hardware, firmware or any combination of the three. Also, wherever a component, an example of which is a module, is implemented as software, the component can be implemented as a standalone program, as part of a larger program, as a plurality of separate programs, as a statically or dynamically linked library, as a kernel loadable module, as a device driver, and/or in every and any other way known now or in the future in computer programming. Additionally, the present techniques and technologies are in no way limited to implementation in any specific programming language, or for any specific operating system or environment. Accordingly, the disclosure of the present techniques and technologies is intended to be illustrative, but not limiting.

What is claimed is:

1. A channel circuit, comprising:
    an analog-to-digital converter configured with a sample rate that is an integer multiple of a baud rate of the channel circuit to generate an oversampled digital signal from an analog data signal;
    a digital sample interpolator configured to:
        receive the oversampled digital signal;
        interpolate multiple digital sample values from the oversampled digital signal to determine interpolated digital signal values; and
        output a baud rate digital signal comprised of interpolated digital signal values selected at the baud rate of the channel circuit; and
    an iterative detector configured to detect data bits from the baud rate digital signal.

2. The channel circuit of claim 1, wherein the analog-to-digital converter receives a time base signal of at least the sample rate.

3. The channel circuit of claim 1, wherein the iterative detector is further configured to detect the data bits from the baud rate digital signal based on a target timing, wherein the target timing is based on alignment of the selected interpolated digital signal values with data bit representations from the analog data signal.

4. The channel circuit of claim 3, further comprising:
    an equalization circuit configured to:
        equalize the baud rate digital signal from the analog-to-digital converter; and
        provide the baud rate digital signal to the iterative detector.

5. The channel circuit of claim 4, further comprising:
    a gradient engine configured to:
        determine a timing gradient from the iterative detector and the equalization circuit; and
        feedback the timing gradient to the digital sample interpolator, wherein the digital sample interpolator, the iterative detector, the equalization circuit, and the gradient engine comprise a timing loop configured to align a timing of the baud rate digital signal with the target timing.

6. The channel circuit of claim 1, further comprising:
    a plurality of iterative detectors configured to detect data bits from a plurality of baud rate digital signals based on a target timing, wherein:
        the digital sample interpolator is configured with a plurality of offset values for determining the plurality of baud rate digital signals;
        the plurality of iterative detectors includes the iterative detector;
        the plurality of baud rate signals includes the baud rate signal; and
        the target timing is based on alignment of the selected interpolated digital signal values with data bit representations from the analog data signal.

7. The channel circuit of claim 6, wherein the plurality of offset values comprises:
    a zero offset value;
    at least one positive offset value; and
    at least one negative offset value.

8. The channel circuit of claim 1, wherein the digital sample interpolator uses at least two-point polynomial interpolation based on a digital finite impulse response structure.

9. The channel circuit of claim 1, wherein the sample rate of the analog-to-digital converter is at least double the baud rate of the channel circuit.

10. The channel circuit of claim 1, further comprising:
    an anti-aliasing filter configured to:
        receive the oversampled digital signal from the analog-to-digital converter;
        implement a stop-band for the oversampled digital signal; and
        output the oversampled digital signal to the digital sample interpolator.

11. A data storage device comprising the channel circuit of claim 1 and further comprising:
a non-volatile storage medium configured to store data; and
a read element configured to generate the analog data signal from the non-volatile storage medium.

12. A method comprising:
generating, by an analog-to-digital converter configured with a sample rate that is an integer multiple of a baud rate of a channel circuit, an oversampled digital signal from an analog data signal;
interpolating, by a digital sample interpolator, multiple digital sample values from the oversampled digital signal to determine interpolated digital signal values; and
determining, by the digital sample interpolator and for use by an iterative detector, a baud rate digital signal comprised of interpolated digital signal values selected at the baud rate of the channel circuit.

13. The method of claim 12, further comprising:
receiving, by the analog-to-digital converter, a time base signal of at least the sample rate.

14. The method of claim 12, further comprising:
detecting, by the iterative detector, data bits from the baud rate digital signal based on a target timing, wherein the target timing is based on alignment of the selected interpolated digital signal values with data bit representations from the analog data signal.

15. The method of claim 14, further comprising:
equalizing the baud rate digital signal from the analog-to-digital converter for use by the iterative detector.

16. The method of claim 14, further comprising:
determining a timing gradient from the iterative detector;
feeding back the timing gradient to the digital sample interpolator; and
aligning a timing of the baud rate digital signal with the target timing.

17. The method of claim 12, further comprising:
determining, by the digital sample interpolator and using a plurality of offset values, a plurality of baud rate digital signals from the oversampled digital signal;
providing the plurality of baud rate digital signals to a plurality of iterative detectors;
detecting, by the plurality of iterative detectors and from corresponding baud rate digital signals of the plurality of baud rate digital signals, data bits based on a target timing, wherein the target timing is based on alignment of the selected interpolated digital signal values with data bit representations from the analog data signal; and
selecting, based on a comparison of the detected data bits, the corresponding baud rate digital signal for use in decoding data from the analog data signal.

18. The method of claim 17, wherein determining the plurality of baud rate digital signals includes:
determining, using a zero offset value, a first baud rate digital signal of the plurality of baud rate digital signals;
determining, using a positive offset value, a second baud rate digital signal of the plurality of baud rate digital signals; and
determining, using a negative offset value, a third baud rate digital signal of the plurality of baud rate digital signals.

19. The method of claim 12, wherein interpolating interpolated digital signal values uses at least two-point polynomial interpolation based on a digital finite impulse response structure.

20. The method of claim 12, wherein the sample rate of the analog-to-digital converter is at least double the baud rate of the channel circuit.

21. A data storage device comprising:
a non-volatile storage medium;
a channel circuit;
means for generating, using a sample rate that is an integer multiple of a baud rate of the channel circuit, an oversampled digital signal from an analog data signal;
means for interpolating multiple digital sample values from the oversampled digital signal to determine interpolated digital signal values;
means for determining a baud rate digital signal comprised of interpolated digital signal values selected at the baud rate of the channel circuit; and
means for determining timing for iterative detection of data bits from the baud rate digital signal based on a target timing, wherein the target timing is based on alignment of the selected interpolated digital signal values with data bit representations from the analog data signal.

22. A channel circuit, comprising:
an analog-to-digital converter configured with a sample rate that is an integer multiple of a baud rate of the channel circuit to generate an oversampled digital signal from an analog data signal;
a digital sample interpolator configured to:
receive the oversampled digital signal;
interpolate multiple digital sample values from the oversampled digital signal to determine interpolated digital signal values; and
output a baud rate digital signal comprised of interpolated digital signal values selected at the baud rate of the channel circuit; and
an anti-aliasing filter configured to:
receive the oversampled digital signal from the analog-to-digital converter;
implement a stop-band for the oversampled digital signal; and
output the oversampled digital signal to the digital sample interpolator.

* * * * *